(12) United States Patent
Kasa et al.

(10) Patent No.: US 8,085,393 B2
(45) Date of Patent: Dec. 27, 2011

(54) EXPOSURE APPARATUS INSPECTION METHOD AND METHOD FOR MANUFACTURING SEMICONDUCTOR DEVICE

(75) Inventors: Kentaro Kasa, Kanagawa-ken (JP); Takashi Sato, Kanagawa-ken (JP); Kazuya Fukuhara, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 337 days.

(21) Appl. No.: 12/554,782

(22) Filed: Sep. 4, 2009

(65) Prior Publication Data

US 2010/0081093 A1  Apr. 1, 2010

(30) Foreign Application Priority Data

Sep. 30, 2008  (JP) ................................. 2008-253537

(51) Int. Cl.
*G01N 11/00* (2006.01)
(52) U.S. Cl. ..................................................... 356/124.5
(58) Field of Classification Search ........... 356/124–127
See application file for complete search history.

(56) References Cited

U.S. PATENT DOCUMENTS

| | | |
|---|---|---|
| 2002/0015158 A1 | 2/2002 | Shiode et al. |
| 2004/0214095 A1 | 10/2004 | Nakao |
| 2009/0021711 A1 | 1/2009 | Sato et al. |

FOREIGN PATENT DOCUMENTS

| | | |
|---|---|---|
| JP | 11-237310 | 8/1999 |
| JP | 2000-36460 | 2/2000 |
| JP | 2002-289503 | 10/2002 |
| JP | 2003-142385 | 5/2003 |

OTHER PUBLICATIONS

Decision of Refusal issued by the Japanese Patent Office on May 18, 2011, for Japanese Patent Application No. 2008-253537, and English-language translation thereof.
Notification of Reason(s) for Refusal issued by the Japanese Patent Office on Dec. 14, 2010, for Japanese Patent Application No. 2008-253537, and English-language translation thereof.

*Primary Examiner* — Tarifur Chowdhury
*Assistant Examiner* — Tara S Pajoohi
(74) *Attorney, Agent, or Firm* — Finnegan, Henderson, Farabow, Garrett & Dunner, L.L.P.

(57) ABSTRACT

A mask pattern includes a first pattern having a line-and-space pattern extending in a first direction, a second pattern formed as a line-and-space pattern having a larger period than the first pattern and extending in the first direction, a third pattern having a line-and-space pattern extending in a second direction, and a fourth pattern formed as a line-and-space pattern having a larger period than the third pattern and extending in the second direction. Illumination light is obliquely incident on the first pattern and the second pattern from a first oblique direction, illumination light is obliquely incident on the third pattern and the fourth pattern from a second oblique direction, and a relative distance from the first pattern to the second pattern transferred on to an image receptor and a relative distance from the third pattern to the fourth pattern transferred onto the image receptor are measured and an optical characteristic of an exposure apparatus is ascertained based on the relative distances.

21 Claims, 8 Drawing Sheets

EXPOSURE APPARATUS INSPECTION METHOD AND METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2008-253537, filed on Sep. 30, 2008; the entire contents of which are incorporated herein by reference.

BACKGROUND OF THE INVENTION

1. Field of the Invention

This invention relates to an exposure apparatus inspection method that inspects optical characteristics of an exposure apparatus used in a lithography process.

2. Background Art

In the case of a general lithography process where a fine resist pattern is formed using a projection exposure apparatus such as, for example, that discussed in JP-A 2003-142385 (Kokai), so-called focal blurring easily occurs and the fine pattern cannot be formed easily as desired unless the optical characteristics of the exposure apparatus, particularly the focal position of the exposure apparatus, are set in a proper state. Especially in recent years, the setting precision of the focal position of the exposure apparatus is becoming extremely important as further downscaling continues for transfer patterns.

SUMMARY OF THE INVENTION

According to an aspect of the invention, there is provided an exposure apparatus inspection method, including providing illumination light obliquely incident on a mask from a direction tilted with respect to an optical axis of an illumination optical system, projecting light diffracted at the mask onto an image receptor via a projection lens, and transferring a pattern formed on the mask onto the image receptor, the pattern formed on the mask including a first pattern formed as a periodic pattern, a second pattern formed as a periodic pattern having a period larger than a period of the first pattern in the same direction as the period of the first pattern, a third pattern formed as a periodic pattern in a periodic direction different from a periodic direction of the first and second patterns, and a fourth pattern formed as a periodic pattern having a period larger than a period of the third pattern in the same direction as the period of the third pattern, the illumination light being obliquely incident on the first pattern and the second pattern from a first oblique direction, the illumination light being obliquely incident on the third pattern and the fourth pattern from a second oblique direction different from the first oblique direction, a relative distance from a transfer pattern of the first pattern to a transfer pattern of the second pattern transferred onto the image receptor and a relative distance from a transfer pattern of the third pattern to a transfer pattern of the fourth pattern transferred onto the image receptor being measured, and an optical characteristic of the exposure apparatus being ascertained based on the two relative distances.

DETAILED DESCRIPTION OF THE INVENTION

An embodiment of the invention will now be described with reference to the drawings.

The exposure apparatus inspection method according to the embodiment of the invention includes providing illumination light obliquely incident on a mask from a direction tilted with respect to an optical axis of an illumination optical system, projecting light diffracted at the mask onto an image receptor via a projection lens, and transferring a pattern formed on the mask onto the image receptor.

Figure 1:
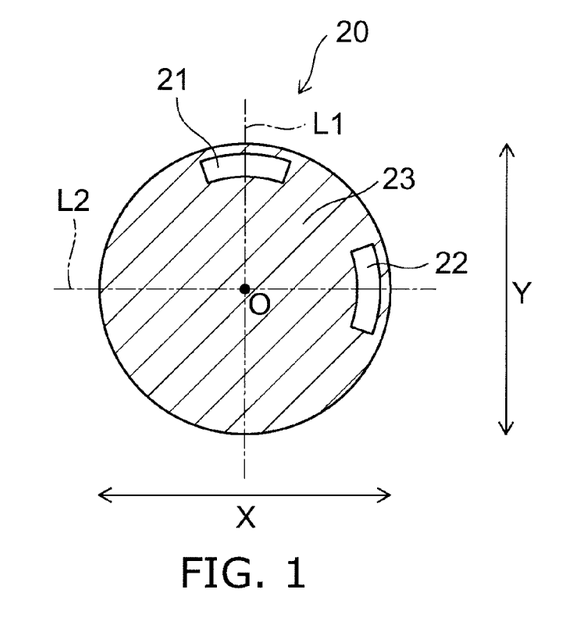
FIG. 1 is a schematic view of an illumination aperture for off-axis illumination used for inspecting an exposure apparatus according to an embodiment of the invention.

Off-axis illumination utilizing an illumination aperture 20 illustrated in FIG. 1 is used as an exposure illumination for the mask. The illumination aperture 20 is provided between an illumination light source and the mask, and a center O of the illumination aperture 20 is aligned with the optical axis of the illumination optical system.

The illumination aperture 20 defines two light emitting units 21 and 22 as light transmitting holes at positions distal to the optical axis. The portions other than the light emitting units 21 and 22 form a light shielding unit 23 that shields light from the light source. Here, a first direction Y and a second direction X perpendicular thereto are introduced for convenience of description. A center of one of the light emitting units 21 is positioned on a straight line L1 passing through the center O of the illumination aperture 20 parallel to the first direction Y. A center of the other light emitting unit 22 is positioned on a straight line L2 passing through the center O of the illumination aperture 20 parallel to the second direction X. That is, the light emitting unit 21 and the light emitting unit 22 are arranged 90° apart in a circumferential direction with respect to the center (the optical axis) O of the illumination aperture 20.

A pattern formed on the mask includes a reference pattern for which a transfer position substantially does not shift due to a focal position shift of the exposure apparatus and a measurement pattern for which a transfer position shifts due to the focal position shift of the exposure apparatus. A focal position shift amount of the exposure apparatus can be ascertained by detecting a relative shift amount from the transfer pattern of the reference pattern to the transfer pattern of the measurement pattern transferred onto the image receptor.

Figure 2:
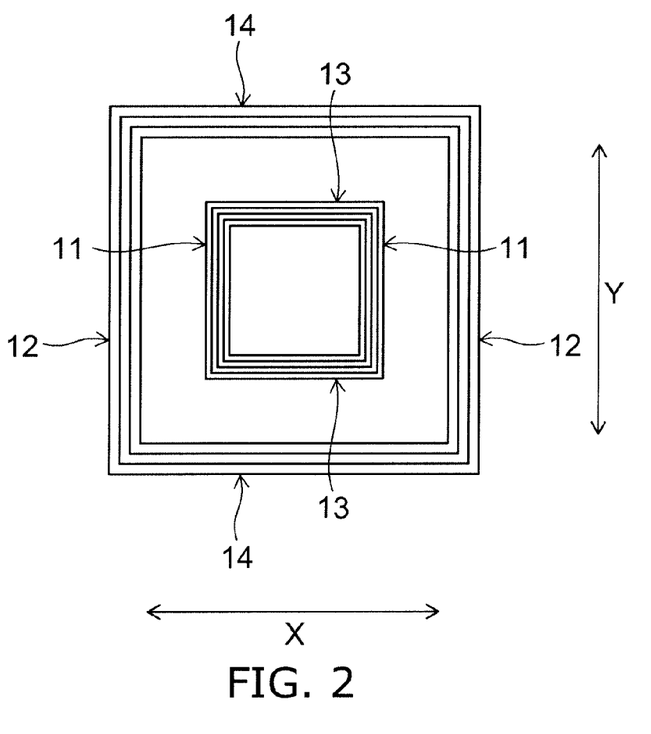
FIG. 2 is a schematic view of a mask pattern receiving the off-axis illumination from the illumination aperture shown in FIG. 1.

FIG. 2 is a schematic view of the pattern formed on the mask. The pattern includes a first pattern 11, a second pattern 12, a third pattern 13, and a fourth pattern 14. The first direction Y and the second direction X illustrated in FIG. 2 correspond to the first direction Y and the second direction X illustrated in FIG. 1.

The first pattern 11 is formed as multiple lines and spaces aligned in the first direction Y. The second pattern 12 is aligned in the same first direction Y as the first pattern 11 and formed as multiple lines and spaces having a period (or pitch) larger than that of the first pattern. The third pattern 13 is formed as multiple lines and spaces aligned in the second direction X. The fourth pattern 14 is aligned in the same second direction X as the third pattern 13 and formed as multiple lines and spaces having a period (or pitch) larger than that of the third pattern 13. The first pattern 11 and the second pattern 12 are periodic in the same direction (the second direction X). The third pattern 13 and the fourth pattern 14 are periodic in the same direction (the first direction Y).

The reference pattern is formed by combining a parallel pair of the first patterns 11 and a parallel pair of the third patterns 13 in a square configuration. The transfer position of the reference pattern substantially does not shift due to a focal position shift of the exposure apparatus. The measurement pattern is formed by combining a parallel pair of the second patterns 12 and a parallel pair of the fourth patterns 14 in a square configuration. The transfer position of the measurement pattern shifts due to the focal position shift of the exposure apparatus. The square of the measurement pattern is larger than the square of the reference pattern. The reference pattern is positioned inside the measurement pattern. The center of the square of the reference pattern is aligned with the center of the square of the measurement pattern on the mask.

The period of the lines and spaces of the second pattern 12 is twice the period of the lines and spaces of the first pattern 11. The period of the lines and spaces of the fourth pattern 14 is twice the period of the lines and spaces of the third pattern 13. The period of the lines and spaces of the first pattern 11 is equivalent to the period of the lines and spaces of the third pattern 13. The period of the lines and spaces of the second pattern 12 is equivalent to the period of the lines and spaces of the fourth pattern 14.

The positional relationship between the illumination aperture 20 and the mask is set such that light from the light emitting unit 22 illustrated in FIG. 1 is obliquely incident on the first pattern 11 and the second pattern 12 from a first oblique direction and light from the light emitting unit 21 is obliquely incident on the third pattern 13 and the fourth pattern 14 from a second oblique direction different from the first oblique direction.

Figure 3A:
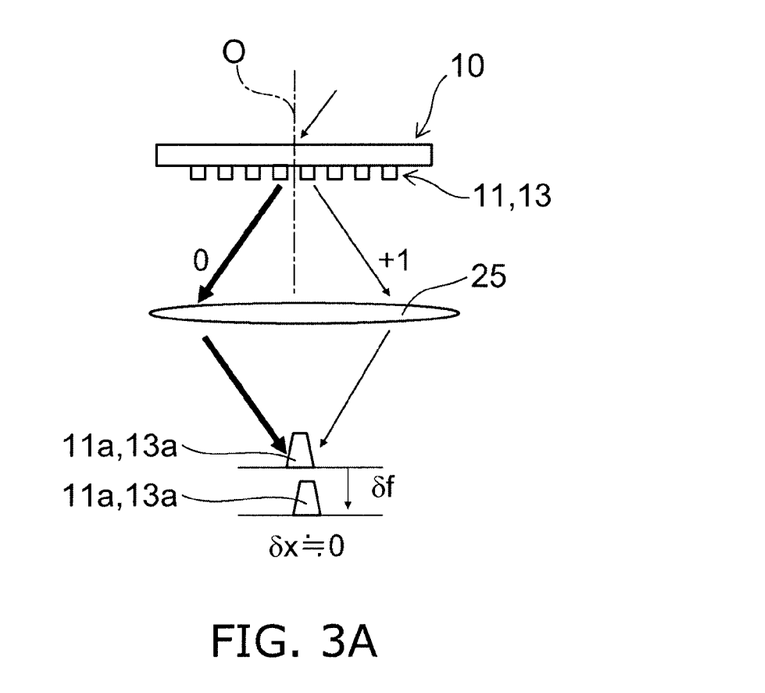
FIG. 3A is a schematic view showing diffraction by a first pattern and a third pattern shown in FIG. 2.
Figure 3B:
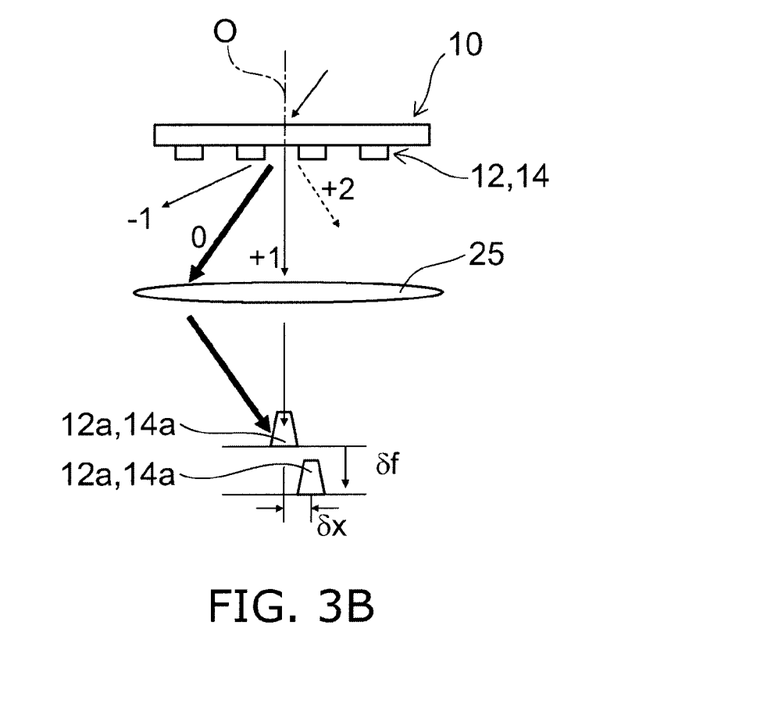
FIG. 3B is a schematic view showing diffraction by a second pattern and a fourth pattern shown in FIG. 2.

FIGS. 3A and 3B illustrate the positional relationship among the mask, the projection lens, and the image receptor.

The mask 10 has a structure in which a light shielding film is formed on a substrate (e.g., a glass substrate) transparent with respect to the exposure illumination wavelength. Openings are selectively made in the light shielding film to form a line-and-space pattern. The image receptor includes, for example, a semiconductor wafer on which a resist film of a photosensitive material is formed.

The periods (or the pitches) of the line-and-space patterns are different in FIG. 3A and FIG. 3B. The pattern illustrated in FIG. 3A corresponds to the first pattern 11 and the third pattern 13 described referring to FIG. 2. The pattern illustrated in FIG. 3B corresponds to the second pattern 12 and the fourth pattern 14. The duty ratio of each pattern (the ratio of the line width to the space width) is 1:1.

Although light from the light emitting unit 22 is incident on the first pattern 11 and the second pattern 12 from the first oblique direction as described above, the first oblique direction is an oblique direction in a range of angles between the optical axis O and the periodic direction (the second direction X) of the lines and spaces of the first pattern 11 and the second pattern 12. The first oblique direction in the mask plane is the same direction as the periodic direction of the first pattern 11 and the second pattern 12.

Although light from the light emitting unit 21 is incident on the third pattern 13 and the fourth pattern 14 from the second oblique direction, the second oblique direction is an oblique direction in a range of angles between the optical axis O and the periodic direction (the first direction Y) of the lines and spaces of the third pattern 13 and the fourth pattern 14. The second oblique direction in the mask plane is the same direction as the periodic direction of the third pattern 13 and the fourth pattern 14.

In FIG. 3B, +1st order diffracted light travels in the optical axis direction; +2nd order diffracted light does not occur; and −1st order diffracted light and +3rd order diffracted light go outside of the pupil (the projection lens 25) of the projection optical system. Therefore, only 0th order diffracted light and +1st order diffracted light asymmetrical with respect to the optical axis O form asymmetrically diffracted light incident on the projection lens 25. In such a case where a shift δf the focal position occurs with respect to the best focal position, patterns 12a and 14a transferred onto the image receptor are shifted δx with respect to the case of the best focus. δx is the shift amount in the periodic direction of the lines and spaces. For the transfer pattern 12a of the second pattern 12, δx is the shift amount in the second direction X. For the transfer pattern 14a of the fourth pattern 14, δx is the shift amount in the first direction Y. The period of the lines and spaces of the second pattern 12 and the fourth pattern 14 is set such that asymmetrically diffracted light such as that described above occurs.

Conversely, for the first pattern 11 and the third pattern 13, in which lines and spaces are formed at a period twice the period of the lines and spaces of the second pattern 12 and the fourth pattern 14, symmetrically diffracted light occurs in which 0th order diffracted light and +1st order diffracted light symmetric with respect to the optical axis O are incident on the projection lens 25 as illustrated in FIG. 3A, and the positions of the transfer patterns 11a and 13a (the positions in the periodic direction of the lines and spaces) are substantially the same even when the focus is shifted. Accordingly, the focus shift, i.e., one optical characteristic of the exposure apparatus, can be measured by measuring the relative distance from the transfer pattern 11a of the first pattern 11 to the transfer pattern 12a of the second pattern 12 transferred onto the image receptor and the relative distance from the transfer pattern 13a of the third pattern 13 to the transfer pattern 14a of the fourth pattern 14 transferred onto the image receptor.

Figure 4:
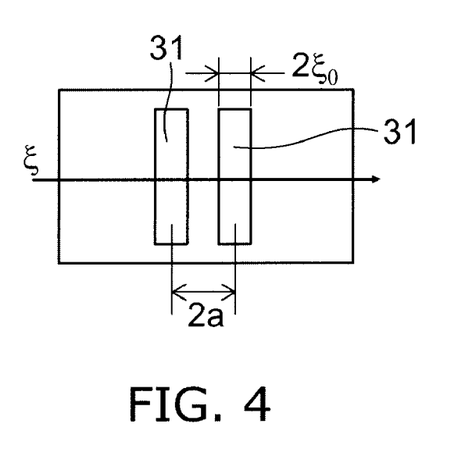
FIG. 4 is a schematic view showing an example of a diffraction grating.

For example, an intensity I(x) at a position x on a screen of diffracted light passing through a diffraction grating as illustrated in FIG. 4 can be expressed as formula (1). $\xi$ is a coordinate axis aligned in the adjacent arrangement direction of slits 31 of FIG. 4, $2\xi_0$ is a width of each of the slits 31, and $2a$ is a distance between centers of adjacent slits 31.

$$I(x) = I_0 \left( \frac{\sin \frac{2\pi \xi_0 x}{\lambda f}}{\frac{2\pi \xi_0 x}{\lambda f}} \right)^2 \left( \frac{\sin \frac{2\pi \text{Max}}{\lambda f}}{M \sin \frac{2\pi a x}{\lambda f}} \right)^2 \quad (1)$$

Here, λ is the wavelength, f is the distance from the slits 31 to the screen, M is the number of slits 31, and $I_0$ is the intensity at the center (x=0) of the diffraction image. The first term of formula (1) represents a diffraction image of Fraunhofer diffraction occurring at one of the slits 31 and is equal to zero at the positions of formula (2).

$$x_m = \frac{m\lambda f}{2\xi_0} \quad (m \text{ is an integer}) \quad (2)$$

The second term of formula (1) represents interference fringes by M slits 31 and has maximums at the following positions.

$$x_N = \frac{N\lambda f}{2a} \quad (N \text{ is an integer}) \quad (3)$$

These maximums are the locations of diffracted light, and N is the diffraction order. Here, diffracted light of a designated diffraction order is zero when $x_m = x_N$. That is, formulas (2) and (3) become formulas (4) and (5).

$$\frac{m\lambda f}{2\xi_0} = \frac{N\lambda f}{2a} \quad (4)$$

$$N = m\frac{a}{\xi_0} \quad (5)$$

When $a/\xi_0$ is an integer, N is a maximum, that is, the intensity of Nth order diffracted light is zero. The occurrence position of 2nd order diffracted light where N=2 is the position where N=2m and m=1, that is, where the first term of formula (1) is zero. Therefore, 2nd order diffracted light does not occur in the case where the duty ratio of the slits (the ratio of the slit width to the slit spacing) is 1:1.

Further, a case is now considered where diffracted light occurs for ten slits. M=10 in formula (1). It is possible for light of any diffraction order to be zero by changing the proportion of a and $\xi_0$.

Figure 5:
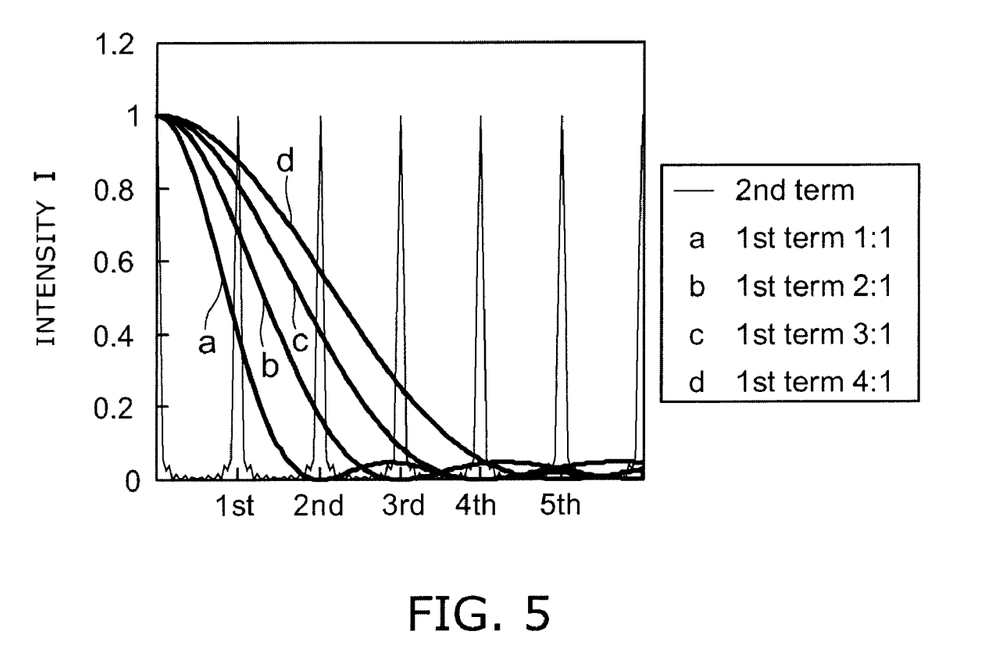
FIG. 5 is a graph showing calculation results of diffracted light intensity of diffracted light by the diffraction grating.

FIG. 5 illustrates calculation results of the diffracted light intensity of the first term and the second term of formula (1) calculated separately and overlaid. The orders of diffracted light are plotted on the horizontal axis, and the intensity I of diffracted light is plotted on the vertical axis. The curve a is the first term in the case where the duty ratio of the slits is 1:1. The curve b is the first term in the case where the duty ratio of the slits is 2:1. The curve c is the first term in the case where the duty ratio of the slits is 3:1. The curve d is the first term in the case where the duty ratio of the slits is 4:1. The second term illustrated by a fine line is diffracted light from ten slits. Thus, it can be seen that the diffracted light of a designated order can be zero by changing the duty ratio of the slits.

For the illumination light incident on the mask at an incident angle α, the formula $$\delta x = d \tan(\alpha) = d \tan(\theta/2) \quad (6)$$

holds for a defocus amount d (corresponding to δf FIGS. 3A and 3B) and the shift amount δx when forming the pattern between 0th order diffracted light incident on the image receptor (the semiconductor wafer) at an incident angle θ and +1st order diffracted light perpendicularly incident on the image receptor.

Assuming that a pattern having a pitch p is formed by perpendicularly incident light and light of the incident angle θ gives the formula $$p \sin \theta = \lambda \quad (7)$$

Figure 6:
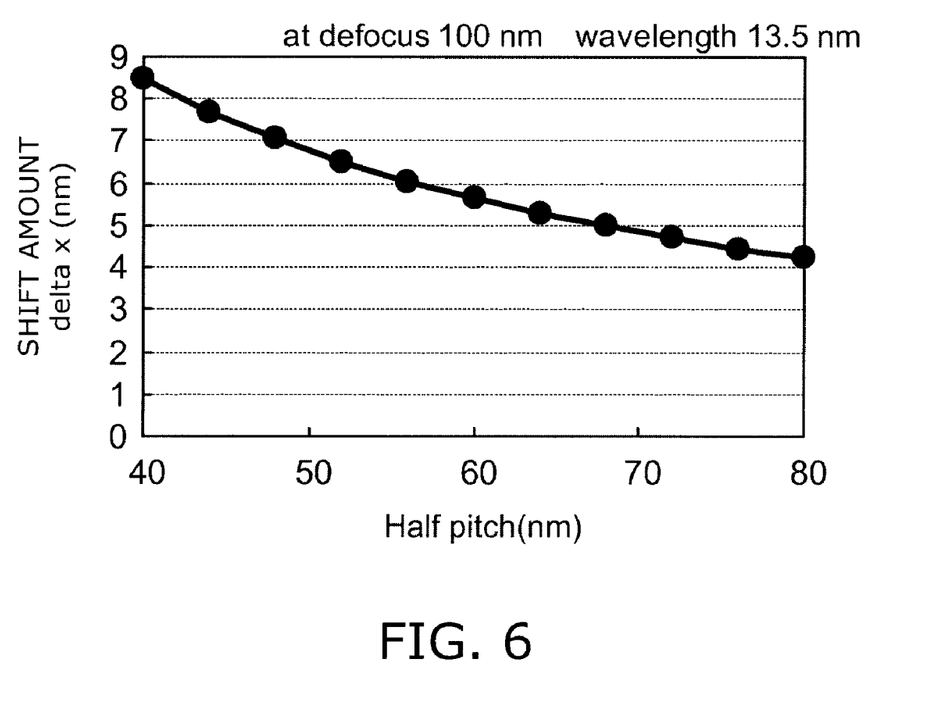
FIG. 6 is a graph showing the relationship between a pattern half pitch and a shift amount of transfer position for a defocus of 100 nm at EUV light with a wavelength of 13.6 nm.

FIG. 6 illustrates the defocus of an EUV (Extreme Ultraviolet) exposure apparatus using a reflective mask and the shift amount of the transfer pattern. FIG. 6 illustrates the relationship between the half pitch and the shift amount ascertained from formulas (6) and (7) for a defocus of 100 nm. For example, a half pitch of 56 nm results in a shift amount of 6 nm.

As described above referring to FIG. 3B, it is necessary for 0th order and +1st order light to enter the pupil (the projection lens) 25 of the projection optical system, +2nd order light to be zero, and −1st order light and +3rd order light to go outside of the pupil of the projection optical system for the pattern for which the transfer pattern position is shifted due to defocus when performing focus monitoring by this method.

Figure 7:
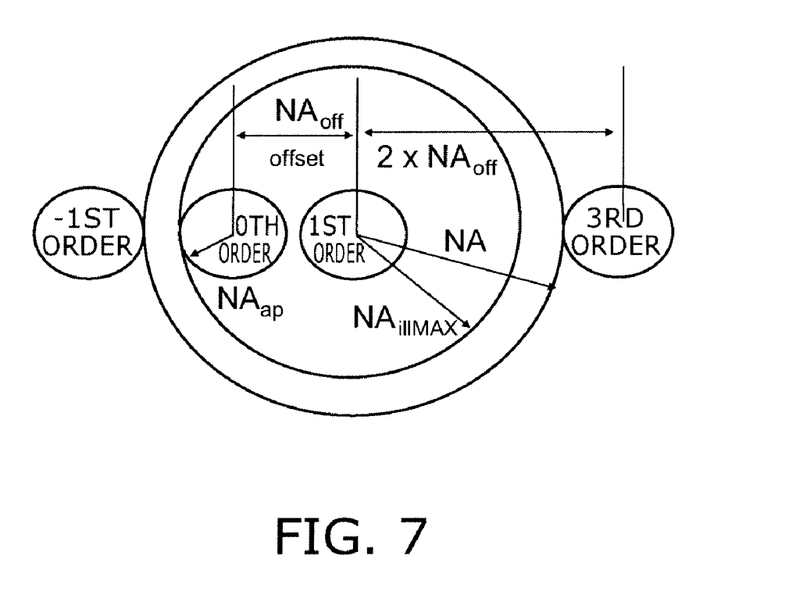
FIG. 7 is a schematic view for describing the relationship among the illumination, diffracted light by the mask pattern and the pupil of the projection optical system

As schematically illustrated in FIG. 7, the formula $$(NA + NA_{ap})/2 < NA_{off} < NA_{illMAX} - NA_{ap} \quad (8)$$

holds, where $\sigma_{ap}$ ($NA_{ap}$) is the radius of the light emitting unit defined as a light transmitting hole in the aperture for off-axis illumination, $\sigma_{offset}$ ($NA_{off}$) is the offset amount of the center of the light emitting unit with respect to the center of the aperture, and $\sigma_{MAX}$ ($NA_{illMAX}$) is the coherency σ value of the range where the illumination light source can be maximized.

Here, from the relationship of 0th order diffracted light and +1st order diffracted light, the formula $$(1/NA_{off}) = (p/\lambda) \quad (9)$$

holds for the pitch p of the pattern and the light source wavelength. Therefore, formula (8) becomes $$2\lambda/(NA + NA_{ap}) > p > \lambda/(NA_{illMAX} - NA_{ap}) \quad (10)$$

Diffracted light can be completely separated in the case where formula (10) holds. The inequality of the left side of formula (10) is a condition for 3rd order light, and the inequality of the right side is a condition for 0th order light.

Figure 12A:
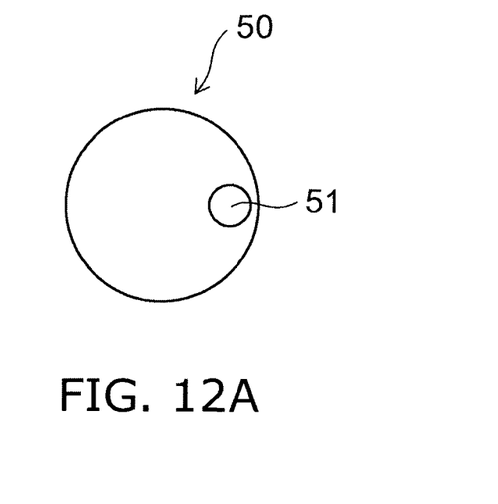
FIGS. 12A and 12B are schematic views showing the position shift of the transfer pattern corresponding to defocus in a comparative example.

Here, the case is considered as a comparative example where the pattern illustrated in FIG. 2 is transferred by exposure using only off-axis illumination from one light emitting unit 51 of an illumination aperture 50 as illustrated in 12a.

Figure 12B:
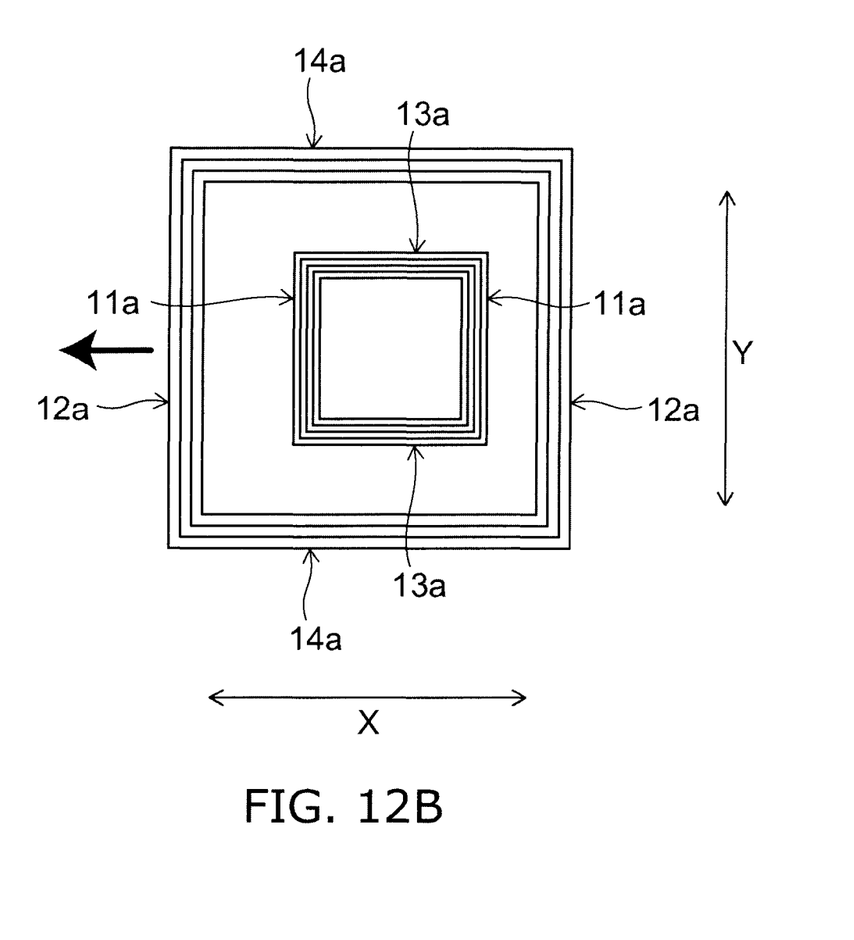

FIG. 12B illustrates the transfer pattern exposed and transferred onto the image receptor. The light emitting unit 51 corresponds to the light emitting unit 22 illustrated in FIG. 1. The first direction Y and the second direction X of FIG. 12B correspond to those illustrated in FIGS. 1 and 2.

Of the second pattern 12 and the fourth pattern 14 forming the measurement pattern recited above, only the transfer pattern 12a of the second pattern 12 shifts in one direction (in this case, the second direction X) in the case where focus shift occurs in the comparative example utilizing off-axis illumination from only one direction. The off-axis illumination light from the light emitting unit 51 is not incident to intersect the alignment direction (the second direction X) of the lines and spaces of the third pattern 13 and the fourth pattern 14, and the third pattern 13 and the fourth pattern 14 are not resolved as images on the image receptor.

Conversely, the embodiment of the invention uses off-axis illumination of the first to fourth patterns 11 to 14 from two different directions by using the illumination aperture 20 illustrated in FIG. 1. Thereby, the focus shift is transformed into a transfer pattern shift in two different directions.

Figure 8:
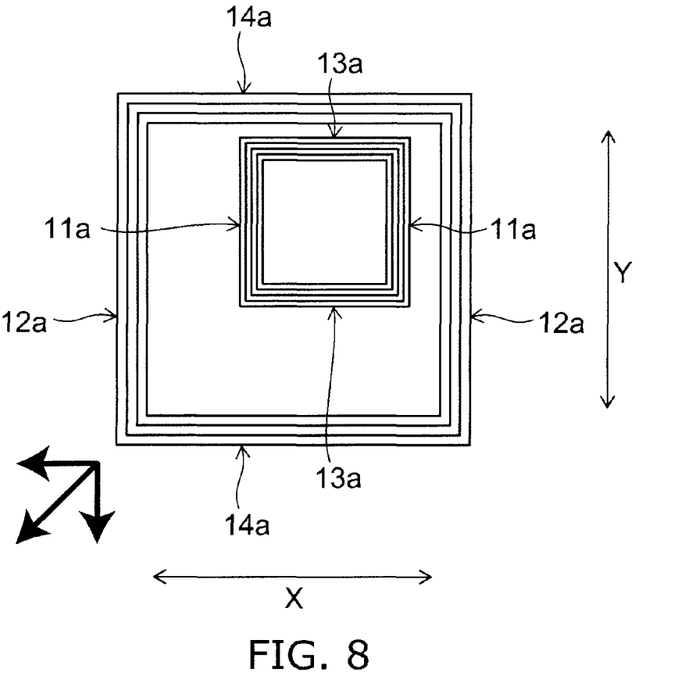
FIG. 8 is a schematic view showing a position shift of a transfer pattern corresponding to defocus in the embodiment of the invention.

In other words, of the second pattern 12 and the fourth pattern 14 forming the measurement pattern, the transfer pattern 12a of the second pattern 12 shifts in the second direction X due the off-axis illumination light from the light emitting unit 22 and the transfer pattern 14a of the fourth pattern 14 shifts in the first direction Y due to the off-axis illumination light from the light emitting unit 21 in the case where focus shift occurs as illustrated in FIG. 8. As a result, the detection sensitivity of the transfer pattern shift due to the focus shift is √2 times that of the comparative example recited above. Thus, focus shift can be monitored with high precision, and the desired pattern formation can be performed by adjusting the exposure apparatus based on the results.

Figure 9:
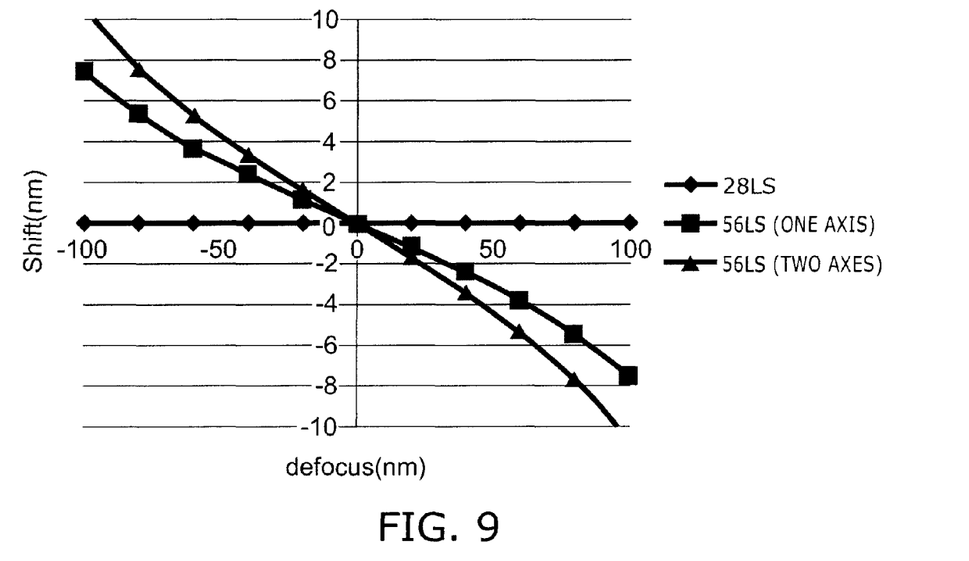
FIG. 9 is a graph showing simulation results predicting the shift amount of the transfer pattern due to defocus.

Here, FIG. 9 illustrates simulation results predicting the shift amount of the transfer pattern due to defocus. The defocus amount (nm) is plotted on the horizontal axis, and the shift amount (nm) of the pattern transferred onto the image receptor is plotted on the vertical axis.

In the case of a line-and-space pattern having a half pitch of 28 nm ("28 LS"), substantially no shift of the transfer pattern occurs due to defocus. Accordingly, a line-and-space pattern having a half pitch of 28 nm may be selected as the first pattern 11 and the third pattern 13 forming the reference pattern recited above.

Comparing the case where a line-and-space pattern having a half pitch of 56 nm is exposed by off-axis illumination only in the one direction illustrated in FIGS. 12A and 12B ("56 LS (one axis)") to the case where a line-and-space pattern having a half pitch of 56 nm is exposed by the bidirectional off-axis illumination of the embodiment of the invention described above ("56 LS (two axes)"), the shift amount of the transfer pattern of "56 LS (two axes)" is larger for the same defocus amount.

While a defocus amount of 16 nm is detectable using an alignment shift inspection apparatus having a measurement precision of 1.5 nm for "56 LS (one axis)," a defocus amount of 23 nm is detectable using the alignment shift detection apparatus having a measurement precision of 1.5 nm for "56 LS (two axes)."

Additionally, it is possible also to combine the second pattern 12 and the fourth pattern 14 having lines and spaces with half pitches of, for example, 44 nm and the first pattern 11 and the third pattern 13 having lines and spaces with half pitches of 22 nm.

Although off-axis illumination may be provided separately by the two light emitting units 21 and 22 during two separate exposures to acquire the relative distance from the transfer pattern 11a of the first pattern 11 to the transfer pattern 12a of the second pattern 12 and the relative distance from the transfer pattern 13a of the third pattern 13 to the transfer pattern 14a of the fourth pattern 14 in the embodiment of the invention, performing exposure simultaneously by off-axis illumination from the two light emitting units 21 and 22 enables inspections using fewer exposures and smaller exposure amounts. This embodiment does not use a phase shift mask and therefore can provide high output and is applicable also to an EUV exposure apparatus for which a phase shift mask is difficult to manufacture.

The first pattern 11 and the second pattern 12 formed as lines and spaces aligned in the first direction Y have a different best focal position than the third pattern 13 and the fourth pattern 14 formed as lines and spaces aligned in the second direction X. This difference is called astigmatism.

In this embodiment, the transfer pattern shift can be measured for each of the first direction Y and the second direction X. Therefore, the astigmatism can be monitored in addition to the focus shift as an optical characteristic of the exposure apparatus.

The pattern layout of this embodiment is a so-called box-in-box configuration in which the periodic direction of the first pattern 11 and the second pattern 12 is orthogonal to the periodic direction of the third pattern 13 and the fourth pattern 14. Also in the box-in-box configuration, the reference pattern has a square configuration formed of the first pattern 11 and the third pattern 13 positioned inside the measurement pattern having a square configuration formed of the second pattern 12 and the fourth pattern 14. Therefore, it is easy to confirm the shift of the transfer pattern of the measurement pattern with respect to the transfer pattern of the reference pattern in two directions (the first direction Y and the second direction X) on the image receptor.

Figure 10:
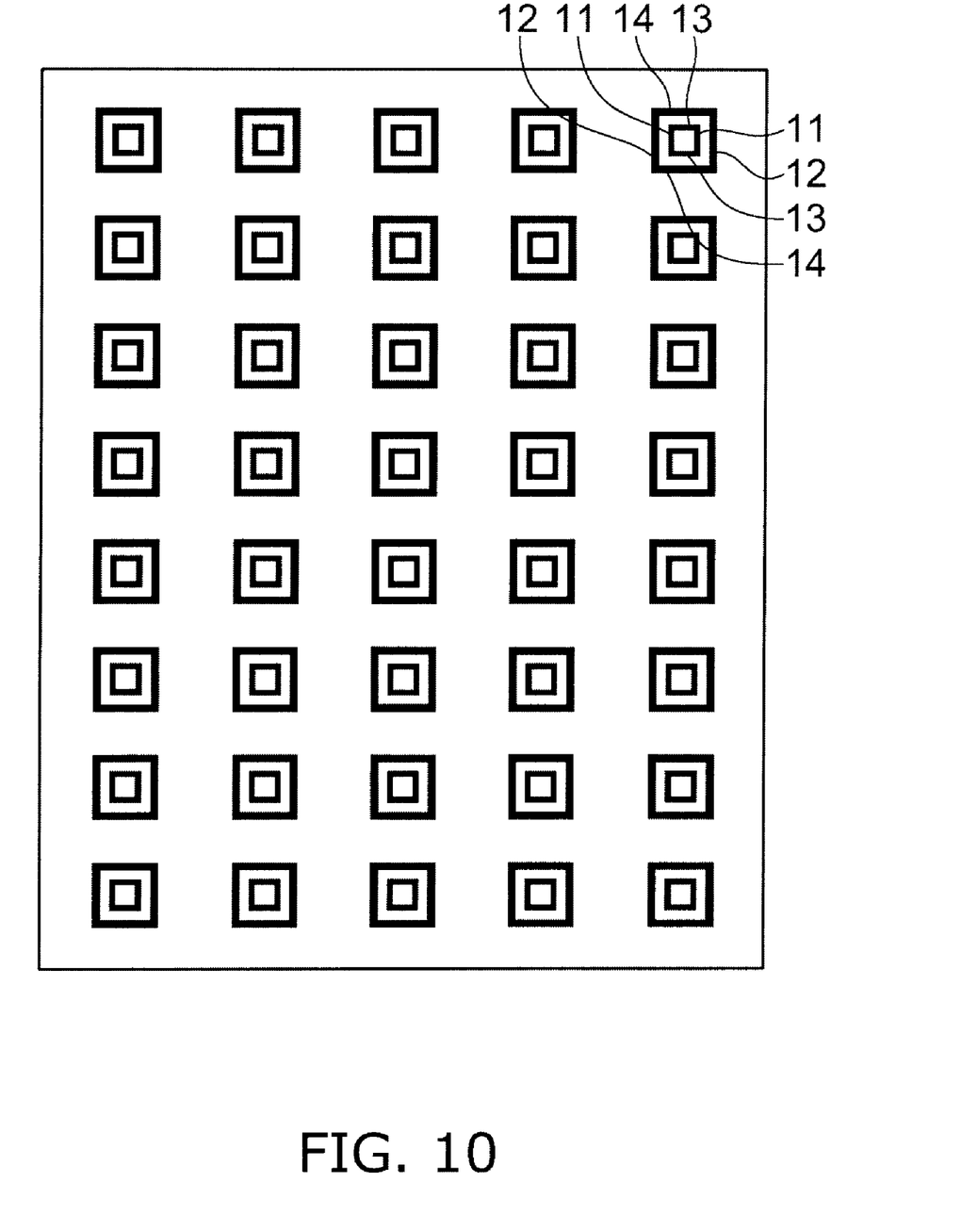
FIG. 10 is a schematic view of the mask having multiple box-in-box patterns formed shown in FIG. 2.

The pattern of the box-in-box configuration recited above is not limited to only one configuration formed on one mask. Multiple configurations may be formed as illustrated in FIG. 10. In such a case, it is possible to identify the kind of aberration occurring in the exposure apparatus from the distribution of the defocus amounts δf1 to δfn obtained for each of n box-in-box patterns on the mask or the image receptor.

Figure 11A:
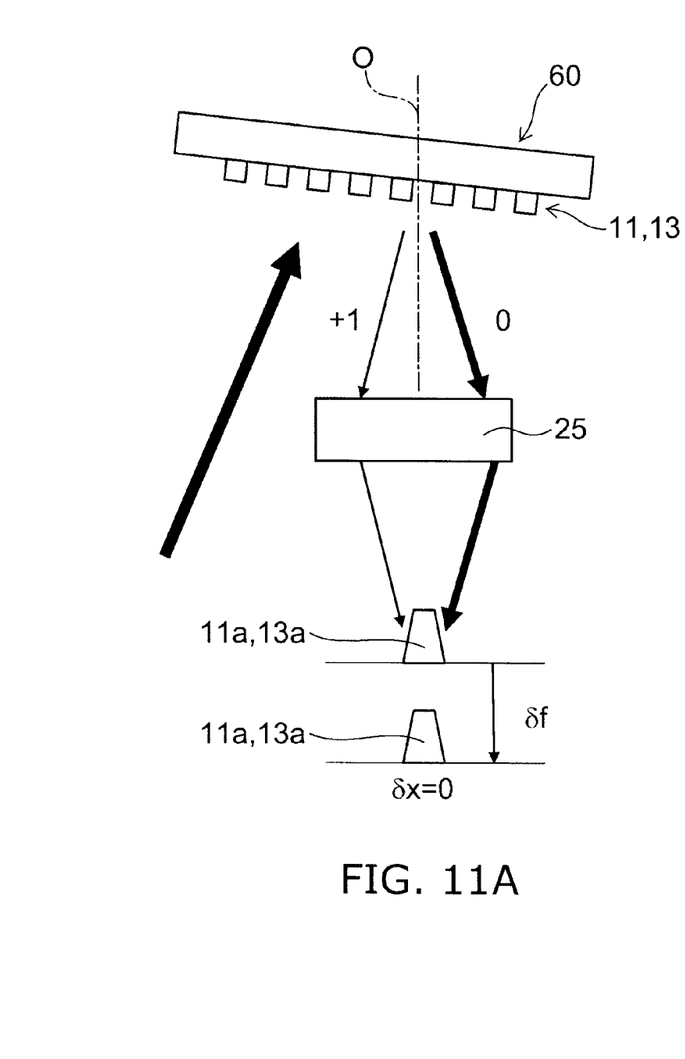
FIGS. 11A and 11B are schematic views similar to FIGS. 3A and 3B based on a reflective mask.
Figure 11B:
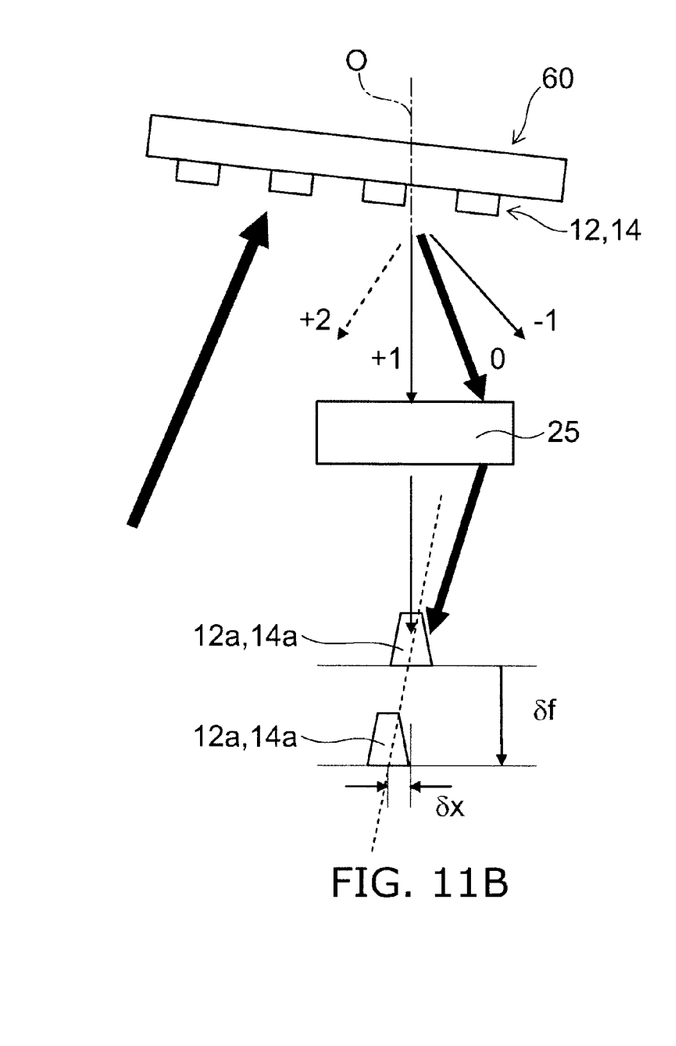

The mask is not limited to the transmissive mask illustrated in FIGS. 3A and 3B. A reflective mask 60 illustrated in FIGS. 11A and 11B may be used. FIG. 11A corresponds to FIG. 3A and illustrates symmetric diffraction of the first pattern 11 and the third pattern 13. FIG. 11B corresponds to FIG. 3B and illustrates asymmetric diffraction of the second pattern 12 and the fourth pattern 14.

Manufacturing processes of a semiconductor device may proceed as described below using the exposure apparatus for which inspection and adjustment are performed based on the optical characteristics of the exposure apparatus obtained by implementing the method described above.

First, a photomask is made by forming a pattern corresponding to the desired semiconductor circuit pattern by, for example, electron-beam lithography. Then, exposure of a resist formed on a film to be patterned on a semiconductor wafer is performed via the photomask. After developing the resist, etching of the film to be patterned is performed using the resist as a mask to form the desired pattern in the film. According to this embodiment, the optical characteristics of the exposure apparatus can be set with good precision as described above. Therefore, as a result, yield of the semiconductor manufacturing processes can be improved, and a high-quality semiconductor device can be provided.

Hereinabove, embodiments of the invention are described with reference to specific examples. However, the invention is not limited thereto, and various modifications are possible based on the technical spirit of the invention.

The first direction Y and the second direction X are illustrated as two perpendicular directions in the embodiment recited above, but are not limited thereto. The angle (tilt) between the two directions may be set arbitrarily within a non-parallel range. Accordingly, it is possible to appropriately modify the arrangement of the two light emitting units 21 and 22 of the illumination aperture 20 and the angle from the alignment direction of the first pattern 11 and the second pattern 12 to the alignment direction of the third pattern 13 and the fourth pattern 14. The invention is applicable also to periodic patterns other than lines and spaces.

The invention claimed is:

1. An exposure apparatus inspection method, comprising providing illumination light obliquely incident on a mask from a direction tilted with respect to an optical axis of an illumination optical system, projecting light diffracted at the mask onto an image receptor via a projection lens, and transferring a pattern formed on the mask onto the image receptor, the pattern formed on the mask including a first pattern formed as a periodic pattern, a second pattern formed as a periodic pattern having a period larger than a period of the first pattern in the same direction as the period of the first pattern, a third pattern formed as a periodic pattern in a periodic direction different from a periodic direction of the first and second patterns, and a fourth pattern formed as a periodic pattern having a period larger than a period of the third pattern in the same direction as the period of the third pattern, the illumination light being obliquely incident on the first pattern and the second pattern from a first oblique direction, the illumination light being obliquely incident on the third pattern and the fourth pattern from a second oblique direction different from the first oblique direction, a relative distance from a transfer pattern of the first pattern to a transfer pattern of the second pattern transferred onto the image receptor and a relative distance from a transfer pattern of the third pattern to a transfer pattern of the fourth pattern transferred onto the image receptor being measured, and an optical characteristic of the exposure apparatus being ascertained based on the two relative distances.

2. The method according to claim 1, wherein:

a reference pattern is formed by combining a parallel pair of the first patterns and a parallel pair of the third patterns into a square configuration;

a measurement pattern is formed by combining a parallel pair of the second patterns and a parallel pair of the fourth patterns into a square configuration;

a transfer pattern of the reference pattern substantially does not shift for a focal position shift of the exposure apparatus; and a position of a transfer pattern of the measurement pattern shifts more than a position of a transfer pattern of the reference pattern for a focal position shift of the exposure apparatus.

3. The method according to claim 2, wherein a square forming the measurement pattern is larger than a square forming the reference pattern, and the reference pattern is formed inside the measurement pattern.

4. The method according to claim 3, wherein a center of the square forming the reference pattern of the mask is aligned with a center of the square forming the measurement pattern of the mask.

5. The method according to claim 3, wherein combinations of the square forming the reference pattern and the square forming the measurement pattern are multiply formed on the mask.

6. The method according to claim 1, wherein a period of a periodic pattern of the first pattern and the third pattern is set such that diffracted light occurring at each of the first pattern and the third pattern includes 0th order diffracted light and +1st order diffracted light symmetric with respect to the optical axis to form symmetrically diffracted light incident on the projection lens.

7. The method according to claim 1, wherein a period of a periodic pattern of the second pattern and the fourth pattern is set such that diffracted light occurring at each of the second pattern and the fourth pattern includes +1st order diffracted light traveling in an optical axis direction, does not include +2nd order diffracted light, and includes asymmetrically diffracted incident light formed of only 0th order diffracted light and +1st order diffracted light asymmetric with respect to the optical axis and incident on the projection lens.

8. The method according to claim 1, wherein a periodic direction of the first pattern and the second pattern is orthogonal to a periodic direction of the third pattern and the fourth pattern.

9. The method according to claim 1, wherein the first oblique direction in the mask plane is the same direction as a periodic direction of the first and second patterns, and the second oblique direction in the mask plane is the same direction as a periodic direction of the third and fourth patterns.

10. The method according to claim 1, wherein the periodic patterns are line-and-space patterns.

11. The method according to claim 10, wherein the first pattern and the second pattern are line-and-space patterns aligned in the same direction.

12. The method according to claim 10, wherein the third pattern and the fourth pattern are line-and-space patterns aligned in the same direction.

13. The method according to claim 10, wherein a ratio of a line width to a space width of the line-and-space pattern is 1:1.

14. The method according to claim 10, wherein a transfer pattern of the line-and-space pattern shifts in a periodic direction of the line-and-space pattern in the case where a focal position shift of the exposure apparatus occurs.

15. The method according to claim 1, wherein:

a period of the first pattern and a period of the third pattern are equivalent;

a period of the second pattern and a period of the fourth pattern are equivalent;

a period of the second pattern is twice a period of the first pattern; and a period of the fourth pattern is twice a period of the third pattern.

16. The method according to claim 1, wherein the obliquely incident illumination light from the first oblique direction and the obliquely incident illumination light from the second oblique direction are simultaneous.

17. The method according to claim 1, wherein the optical characteristic of the exposure apparatus is a focal position shift.

18. The method according to claim 1, wherein the optical characteristic of the exposure apparatus is astigmatism.

19. The method according to claim 1, wherein light transmitted by the mask is projected onto the image receptor.

20. The method according to claim 1, wherein light reflected by the mask is projected onto the image receptor.

21. A method for manufacturing semiconductor device comprising manufacturing a semiconductor device with the exposure apparatus inspected by the method according to claim 1.

* * * * *